(12) United States Patent
Mori et al.

(10) Patent No.: US 9,550,360 B2
(45) Date of Patent: Jan. 24, 2017

(54) METHOD FOR MANUFACTURING AN INKJET PRINT HEAD

(71) Applicant: NLT Technologies, Ltd., Kanagawa (JP)

(72) Inventors: Shigeru Mori, Kanagawa (JP); Setsuo Kaneko, Kanagawa (JP); Hideki Asada, Kanagawa (JP)

(73) Assignee: NLT TECHNOLOGIES, LTD., Kanagawa (JP)

( * ) Notice: Subject to any disclaimer, the term of this patent is extended or adjusted under 35 U.S.C. 154(b) by 0 days.

(21) Appl. No.: 14/926,567

(22) Filed: Oct. 29, 2015

(65) Prior Publication Data
US 2016/0046127 A1  Feb. 18, 2016

Related U.S. Application Data

(62) Division of application No. 14/453,635, filed on Aug. 7, 2014, now Pat. No. 9,211,708.

(30) Foreign Application Priority Data

Aug. 12, 2013 (JP) .................................. 2013-167358
May 13, 2014 (JP) .................................. 2014-099332

(51) Int. Cl.
*B41J 2/16* (2006.01)
*B41J 2/14* (2006.01)
(Continued)

(52) U.S. Cl.
CPC ............. *B41J 2/1601* (2013.01); *B41J 2/0455* (2013.01); *B41J 2/0458* (2013.01);
(Continued)

(58) Field of Classification Search
CPC ..... B41J 2/1601; B41J 2/14016; B41J 2/0458; B41J 2/0455; B41J 2/14129; B41J 2/1626; B41J 2/1634; B41J 2002/14387; B81C 2201/0194; B81C 1/00817; B81C 1/00357; C09K 13/00

See application file for complete search history.

(56) References Cited

U.S. PATENT DOCUMENTS 5,124,717 A * 6/1992 Campanelli ............ B41J 2/1604
216/27
6,234,623 B1 * 5/2001 Drake .................. B41J 2/14032
347/93
(Continued)

FOREIGN PATENT DOCUMENTS

CN  1241159 A  1/2000
JP  11-099649  4/1999
(Continued)

OTHER PUBLICATIONS

Chinese Official Action—201410393734.0—Nov. 18, 2016.

Primary Examiner — Anita Alanko
(74) Attorney, Agent, or Firm — Young & Thompson

(57) ABSTRACT

Provided are a manufacturing method of an inkjet print head, the inkjet print head and a drawing apparatus equipped with the inkjet print head. The manufacturing method includes: forming a separation assisting layer on a substrate; forming heating resistors, thin-film transistors and nozzles for ejecting liquid, on the separation assisting layer; separating the separation assisting layer from the substrate; forming a first heat-conductive layer on the opposite surface of the separation assisting layer from the nozzles; and forming an ink supply port for supplying ink to the nozzles from a first heat-conductive layer side of the inkjet print head.

4 Claims, 13 Drawing Sheets

(51) Int. Cl.
*B41J 2/045* (2006.01)
*C09K 13/00* (2006.01)
*B81C 1/00* (2006.01)

(52) U.S. Cl.
CPC ....... *B41J 2/14016* (2013.01); *B41J 2/14129* (2013.01); *B41J 2/1626* (2013.01); *B41J 2/1634* (2013.01); *B41J 2002/14387* (2013.01); *B81C 1/00357* (2013.01); *B81C 1/00817* (2013.01); *B81C 2201/0194* (2013.01); *C09K 13/00* (2013.01)

(56) References Cited

U.S. PATENT DOCUMENTS

| | | | |
|---|---|---|---|
| 6,523,236 B1 | 2/2003 | Nishikawa et al. | |
| 6,779,877 B2 * | 8/2004 | Andrews | B41J 2/1404 347/65 |
| 6,862,783 B2 | 3/2005 | Nishikawa et al. | |
| 6,869,171 B2 | 3/2005 | Nishikawa et al. | |
| 7,101,030 B2 * | 9/2006 | Clark | B41J 2/16 347/44 |
| 7,901,057 B2 | 3/2011 | Stephenson | |
| 8,806,751 B2 * | 8/2014 | Xie | B41J 2/105 216/41 |
| 2003/0058308 A1 | 3/2003 | Yamamoto | |
| 2007/0220722 A1 * | 9/2007 | Furuya | B41J 2/161 29/25.35 |
| 2007/0220723 A1 * | 9/2007 | Furuya | B41J 2/161 29/25.35 |

FOREIGN PATENT DOCUMENTS

| | | |
|---|---|---|
| JP | 2000-289204 | 10/2000 |
| JP | 2001-191529 | 7/2001 |
| JP | 2002-316419 | 10/2002 |
| JP | 2003-036956 | 2/2003 |
| JP | 2003-170597 | 6/2003 |

* cited by examiner

SILANE COUPLING MATERIAL ON GLASS SUBSTRATE 14

UV-IRRADIATED AREAS

2

METHOD FOR MANUFACTURING AN INKJET PRINT HEAD

TECHNICAL FIELD

The present invention relates to an inkjet print head, a method of manufacturing the same and a drawing apparatus equipped with the same.

BACKGROUND

A drawing apparatuses which is exemplified in a printer and can make drawings on media such as paper, employs an inkjet print head which ejects ink droplets to make drawings. A thermal inkjet printing is one of inkjet printing technologies, such that an electric current is sent to a heating resistor to heat up ink and ink droplets are ejected from a nozzle by pressure of vapor bubbles generated on the heating resistor. As a kind of inkjet print head employing the thermal inkjet printing, there is known an inkjet print head manufactured by combining a substrate on which a heating resistor and a drive circuit are formed and a substrate on which nozzles are formed. From a point of variation in manufacturing accuracy of the substrates and a point of positioning accuracy of the substrates in the process of combining the substrates, the following inkjet print head has been proposed and employed. For example, as described in Japanese Unexamined Patent Application Publication (JP-A) No. H11-99649, the inkjet print head has the following structure: there is provided a silicon substrate on which a heating resistor is formed, and an orifice plate which has ink ejection ports is put on the silicon substrate to be integrated in one body.

From a viewpoint about drawing processing, print heads can be categorized into those employing a scan printing method and those employing a single-path printing method. In the scan printing, a print head performs plural scans (reciprocates) in a direction perpendicular to the conveyance direction of print media. In the single-path printing, a print head remains in a fixed position and completes image printing in a single path on the print media under conveyance. Among printers employing such the technologies, line printers employing the single-path printing method are desired because of their high-speed capability. In the single-path printing method, a print head or print heads need to be arranged in proportion to the size of print media. Therefore, in a line printer for printing on large-sized print media such as an outdoor advertisement, a large number of print heads are arrayed. Especially from a point of resolution, a printer needs a large number of microscopic print heads.

When inkjet print heads using a silicon substrate are employed in such printers, the following problem arises. Since it is generally difficult to create a large-sized silicon substrate and the number of inkjet print heads which can be formed on the substrate is limited, such printers need to use plural inkjet print heads combined together. When a printer employing combined inkjet print heads performs printing, a printed image can have a gap, depending on the processing accuracy and combining accuracy of the inkjet print heads, at a position corresponding to the position where the inkjet print heads are combined together. The gap becomes more conspicuous in high-quality printing. Especially, the single-path printing method is a method that a printer head or printer heads complete image printing in a single path and cannot employ a way to correct the gap during plural scans, which is a problem.

On the other hand, a glass substrate, which is used for technologies including a liquid crystal display device, is manufactured in much larger size in comparison with a silicon substrate, and can be manufactured at low cost. Therefore, there has been proposed a method of manufacturing an inkjet print head on a glass substrate. For example, JP-A No. 2000-289204 discloses an inkjet print head integrated with a driver, wherein the inkjet print head is formed on a glass substrate and includes a heating resistor.

In a print head using the thermal inkjet printing, ink has a temperature as high as several hundred degrees Celsius around a heating resistor. For achieving high-speed printing, a print head needs to repeatedly eject ink droplets at high speed. However, if heat of the print head is accumulated to make the temperature of the print head excessively high, such the condition can make the print head impossible to eject a proper amount of ink and can make a large number of inferior printings, which is a problem. To solve of the problem, a print head needs to conduct and radiate the heat generated in the heating resistor in short time. JP-A No. 2001-191529 discloses the following print head. The print head includes a substrate and a metal heat sink layer. The metal heat sink layer adjoins the substrate and has a plan view shape substantially the same as and congruent with the plan view shape of the substrate. The metal heat sink layer efficiently removes heat generated by resistors or other energy dissipating elements of the print head. Further, JP-A No. 2003-170597 discloses the following inkjet print head. The inkjet print head includes a substrate having a heat conductivity being equal to or less than 15 W/m/K, a heat-conductive layer being equal to or more than 10 μm in thickness and being put on the substrate, a heat insulation layer put on the heat-conductive layer, and a heater put on the heat insulation layer. In the inkjet print head, the heat-conductive layer controls an increase of the temperature around the heater put on the substrate having a low heat conductivity.

Further, JP-A No. 2002-316419 discloses the following inkjet print head which can radiate heat outside efficiently. The inkjet print head includes a glass substrate having top surface and bottom surface on each of which a metal film is formed. On the metal film on the top surface, the following components are layered in order: an insulating film, a heating resistor film, electrodes of individual wirings, a common electrode, barriers and an orifice plate including ink ejection openings. The glass substrate is cut to make an ink supply channel and ink supply openings. In the glass substrate, a through hole is further made and a metal film is formed on the inner wall of the through hall to connect the metal films formed on the both surfaces of the substrate together by thermal coupling.

Regarding a method of manufacturing an inkjet print head, JP No. 2003-36956 discloses the following method of manufacturing a heating resistor. The heating resistor includes an alumina substrate having an excellent heat conductivity and a heat storage layer put on the alumina substrate. With the method of manufacturing the heating resistor, a heat radiation layer and the heat storage layer are formed efficiently with having the well-balanced heat radiation property and heat storage property.

However, the above-described conventional arts have several problems.

A first problem is that they do not show promise of an excellent efficiency of heat conduction. In order to lower the temperature of an object having a quantity of heat, it is important to reduce the quantity of heat of the object by using heat conduction. A heat conductance, in other words, the ease with which a particular material conducts heat can be expressed by the following formula (1). The parameters of the formula are important for an efficient conduction of heat in components such as a heating resistor.

"Heat Conductance"="Heat Conductivity of the Material"×"Cross-Sectional Area for Heat Conduction"/"Length of the Material" (1)

In the inkjet print head disclosed in JP-A No. 2000-289204, a heating layer is covered with a glass substrate, a silicon oxide film and a silicon oxynitride film, which are formed of materials with low heat conductivity. Therefore, the efficiency of the conduction of heat coming from the heating layer deteriorates.

Further, in inkjet print heads disclosed in FIG. 6 and FIG. 7 of JP-A No. 2003-170597, a heat conductive layer for releasing heat generated in the heating resistor, is not arranged in an area of a drive circuit. As described above, heat conduction between solid bodies is proportional to a contact area of layers or films where heat passes. As an inkjet print head is much more downsized, the ratio of an area of the drive circuit in an inkjet print head becomes greater, which reduces an area to contribute to the heat conduction and makes the heat conduction in the inkjet print head difficult.

A second problem is that thin-film transistors (hereinafter, referred to as a TFTs) having sufficient performance are hardly obtained in the above technologies. In a thermal inkjet print head, an electric current is sent to a heating resistor in a short cycle of time (for example, a cycle of the order of magnitude of microseconds) in a printing process. Therefore, a transistor to be connected to the heating resistor needs to have high performance, for example, high mobility. Further, in an inkjet print head integrated with a drive circuit, TFTs as the components of the drive circuit also need to have high performance.

In the print head disclosed in JP-A No. 2001-191529, there is a metal heat sink layer for absorbing heat from a resistor and radiating excess heat therefrom, extending all over the substrate. As a process being used for forming high-performance TFTs on a glass substrate, a process of crystallizing silicon by laser annealing, using an excimer laser is well known. In the process, amorphous silicon as a precursor is deposited at a position apart from a glass substrate in order to prevent the amorphous silicon from being contaminated by impurities coming from the glass substrate. Therefore, in the print head disclosed in JP-A No. 2001-191529 wherein a metal layer is put immediately above the substrate, the a metal layer is located under the amorphous silicon layer. However, on crystalizing silicon by laser annealing, if the metal layer is located under the amorphous silicon layer, heat for melting the amorphous silicon easily leaks out to the metal layer and the amorphous silicon does not reach a sufficient temperature. It makes difficult to prepare crystals having large crystal-grain sizes and to achieve high-performance TFTs having high mobility. This issue can arise similarly in the inkjet print head disclosed in FIG. 5 of JP-A No. 2003-170597, which includes a heat conductive layer put between an active layer (a layer of polycrystalline silicon) and a substrate, and the inkjet print head disclosed in JP-A No. 2002-316419, which includes a metal film formed on the top surface of a substrate. The issue can arise similarly further in the technique to form a heat storage layer and a heating resistor film on an alumina substrate, as disclosed in JP-A No. 2003-36956. That is, when TFTs are being formed on the alumina substrate having an excellent heat conductivity, heat given for melting the amorphous silicon in a process of crystallizing the amorphous silicon by laser annealing easily leaks out into the alumina substrate in spite of existence of the heat storage layer, which makes difficult to achieve high-performance TFTs.

Further, in an inkjet print head having a heat conductive layer being patterned rather than being formed to cover all over the substrate, as disclosed in FIG. 6 of JP-A No. 2003-170597, the process of crystallizing amorphous silicon makes a polycrystalline silicone layer having crystals whose crystal-grain sizes are uneven greatly in the plane of the substrate. Such a condition can cause the problem that the etching rate of dry etching or wet etching varies depending on a position on the substrate and fine silicon residues are created, which produces defects of the inkjet print head. This problem arises because of the following reason. The temperature of a part where the heat conductive layer exists does not rise but the temperature of a part where the heat conductive layer does not exist rises. Depending on existence or nonexistence of the heat conductive layer, there can be created a silicon layer including crystals with uneven grain sizes. A silicon crystal of a small grain size has the great grain boundary and the etching rate for the crystal becomes greater in comparison with a silicon crystal of a larger grain size, which causes this problem. This phenomenon can also be observed in other materials such as silicon carbide (SiC).

The present invention seeks to solve the problems.

SUMMARY

In view of the above problems, there are provided illustrative inkjet print heads, illustrative manufacturing methods of the inkjet print head, and illustrative drawing apparatuses each equipped with the inkjet print head, as embodiments of the present invention. The illustrative inkjet print heads can be formed on a large-sized substrate, conduct heat generated in heating resistors effectively and be equipped with a drive circuit including high performance TFTs. The illustrative drawing apparatuses can achieve high resolution and high-speed drawing capability.

An inkjet print head illustrating one aspect of the present invention is an inkjet print head comprising: a separation assisting layer formed so as to be separated from a substrate put under the separation assisting layer; heating resistors on the separation assisting layer; thin-film transistors on the separation assisting layer; nozzles for ejecting liquid, on the separation assisting layer; and a first heat-conductive layer on an opposite surface of the separation assisting layer from the nozzles, put in place of the substrate.

A manufacturing method of an inkjet print head illustrating one aspect of the present invention is a manufacturing method comprising: forming a separation assisting layer on a substrate; forming heating resistors, thin-film transistors and nozzles for ejecting liquid, on the separation assisting layer; separating the separation assisting layer from the substrate; forming a first heat-conductive layer on an opposite surface of the separation assisting layer from the nozzles; and forming an ink supply port for supplying ink to the nozzles from a first heat-conductive layer side of the inkjet print head.

Other features of illustrative embodiments will be described below.

BRIEF DESCRIPTION OF THE DRAWINGS

Embodiments will now be described, by way of example only, with reference to the accompanying drawings which are meant to be exemplary, not limiting, and wherein like elements numbered alike in several figures, in which.

Each of FIGS. 1A and 1B is a perspective view of an inkjet print head of the first embodiment.

DETAILED DESCRIPTION

Figure 1A:
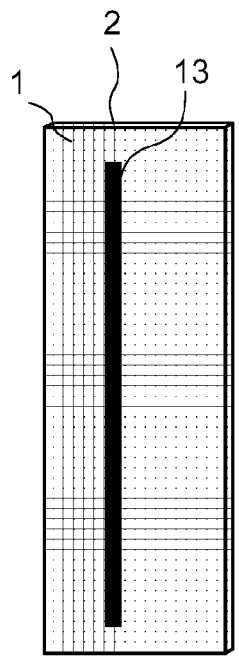

Illustrative embodiments of inkjet print heads, manufacturing methods of the inkjet print head, and drawing apparatuses will be described below with reference to the drawings. It will be appreciated by those of ordinary skill in the art that the description given herein with respect to those figures is for exemplary purposes only and is not intended in any way to limit the scope of potential embodiments may be resolved by referring to the appended claims.

In one illustrative embodiment, a separation assisting layer is formed on a substrate made of a material having a low heat conductivity, such as glass, and then, components including a drive circuit composed of TFTs, heating resistors and nozzles are formed on the separation assisting layer. After these forming processes, the separation assisting layer is separated from the substrate. These processes provide a construction that a drive circuit, heating resistors and nozzles are put on the separation assisting layer. In this embodiment, the thickness of the separation assisting layer can be easily changed on the forming process, and employing a thin separation assisting layer allows the construction to conduct the heat to the bottom-surface side of the separation assisting layer, where the drive circuit, the heating resistors and the nozzles are not formed.

Further, a first heat-conductive layer, which has a high heat conductivity and a great area, is arranged on the bottom surface of the separation assisting layer, which allows the resulting construction to radiate the heat quickly. Accordingly, the construction of the present embodiment can conduct heat generated in the heating resistors to the first heat-conductive layer arranged on the bottom surface of the thin separation assisting layer, and radiate the heat effectively. Therefore, the present embodiment does not employ a thick substrate with a low heat conductivity like a glass substrate, and does not need a heat conductive film (formed on the inner wall of the through hole) for conducting the heat on the top surface of the substrate to the bottom surface of the substrate as disclosed in JP-A No. 2002-316419.

Further, in the embodiment, before forming the active layer of the TFTs, a heat conductive layer formed of a material with a high heat conductivity, such as metal, is not formed between the active layer and the substrate, nor on the bottom surface of the substrate. Therefore, the embodiment can effectively utilize a silicon crystallization technique by laser annealing, which allows to form TFTs with an active layer whose material has high mobility like polycrystalline silicon. Therefore, in the embodiment, multifunctional components such as a drive circuit can be formed on the separation assisting layer.

In addition, the glass substrate which has been used for forming the drive circuit and the heating resistors and the nozzles, can be reused by being cleaned after the separation assisting layer on which the drive circuit and the heating resistors and the nozzles has been formed and separated from the glass substrate. Therefore, inkjet print heads can be manufactured at reduced cost because the material cost can be reduced.

According to the above-described embodiments, there can be provided inkjet print heads each equipped with a drive circuit composed of high-performance TFTs and arrayed densely on a large-sized separation assisting layer with accuracy. Further, in the above-described embodiments, heat generated in the heating resistors can be conducted to the first heat-conductive layer efficiently to be radiated, which allows the inkjet print head to be repeatedly driven at high speed and provides an inkjet print head suitable for high-speed drawing.

Illustrative embodiments of the present invention will be described in detail with reference to drawings.

First Embodiment

Figure 1B:
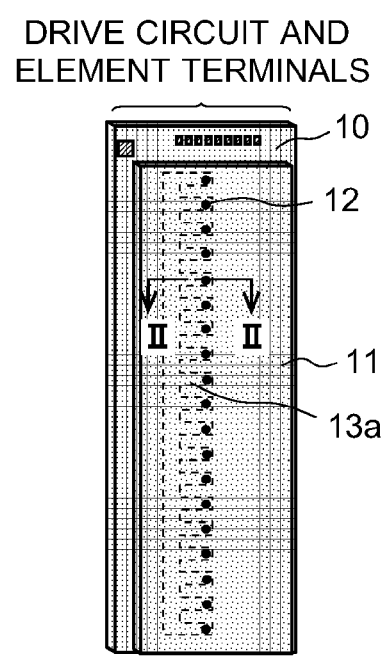
Figure 2:
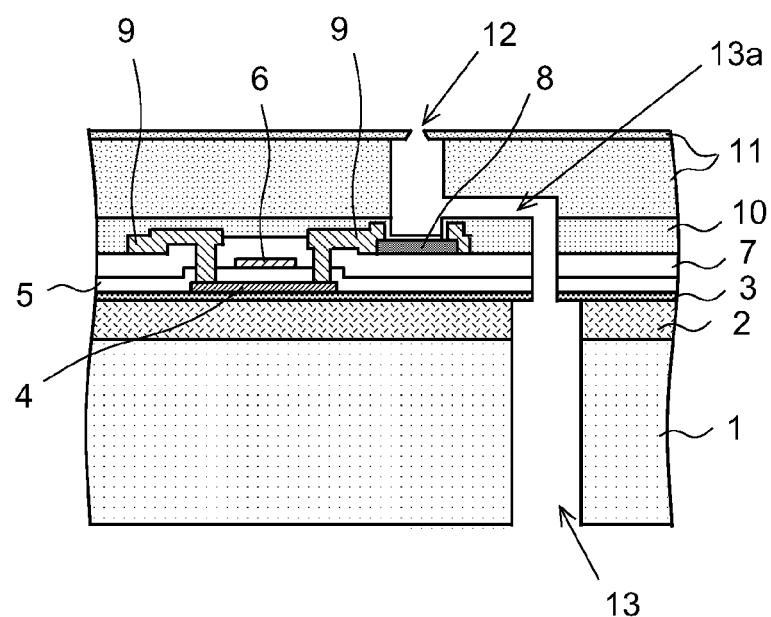
FIG. 2 is a cross-sectional view (taken along the line II-II of FIG. 1B) of an inkjet print head illustrated in FIGS. 1A and 1B.

Each of FIG. 1A and FIG. 1B is a perspective view of an inkjet print head of the first embodiment. FIG. 1A is a perspective view of an inkjet print head viewed from the bottom-surface side (the ink-supplying side) of the inkjet print head and FIG. 1B is a perspective view of the inkjet print head viewed from the upper-surface side (the medium side) of the inkjet print head. FIG. 2 is a cross-sectional view taken along the line II-II of FIG. 1B and schematically illustrating the principal part of the inkjet print head. Though an inkjet print head generally includes plural nozzles, the following embodiments will be described with referring to the drawings of an inkjet print head including a small number of nozzles for easy understanding about the present invention and the embodiments.

As the lowest layer of the construction of FIG. 2, that is, at the bottom of the inkjet print head (the opposite side to the surface on which nozzles 12 are formed), there is prepared first heat-conductive layer 1 with touching with the opposite surface of separation assisting layer 2 from nozzles 12. The first heat-conductive layer 1 may be formed of a single-layer film of one material selected from metals of aluminum, chrome, gold, copper, tungsten, platinum, nickel, iron, molybdenum and titanium; alloy of any of the these metals and another material; carbon materials with high heat conductivity, including carbon nanotubes and graphene; and insulating materials with high heat conductivity, such as aluminum nitride, or a multilayer film constituted by any combination of these single-layer films. Further, the first heat-conductive layer 1 with a greater thickness has greater heat capacity and is capable of restricting an increase of the temperature coming from the transferred heat better. Therefore, the first heat-conductive layer 1 with greater thickness is more preferable, and especially, the thickness of 100 nm or more is much more preferable. However, the excessively great thickness can increase the cost and the thickness can be selected according to circumstances. In order to prevent the inkjet print head from being easily bent and broken, it is preferable that first heat-conductive layer 1 is used as a supporting substrate rather than separation assisting layer 2 with a smaller thickness. In view of that, it is preferable that the first heat-conductive layer 1 is greater in thickness than the separation assisting layer 2.

Figure 3:
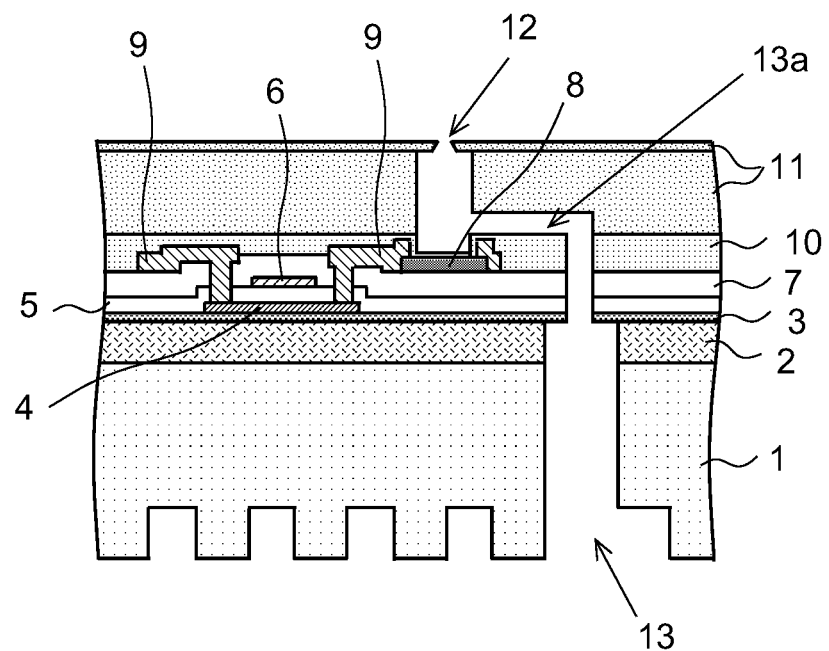
FIG. 3 is a cross sectional view of another inkjet print head of the first embodiment.

First heat-conductive layer 1 is formed, as the diagram of the bottom side of inkjet print head illustrated in FIG. 1A, so as to cover all over separation assisting layer 2 excepting ink supply port 13 (in other words, to occupy the space on the separation assisting layer 2 excluding the ink supply port 13). The first heat-conductive layer 1 has a sufficiently large area to enhance the efficiency of its heat conductivity. Further, as illustrated in FIG. 3, in order to much more enhance the efficiency of the heat conductivity, the first heat-conductive layer 1 may have depressions and projections on its surface, formed for increasing the surface area of its heat radiation surface.

In some cases, the first heat-conductive layer 1 can directly touch with ink. In these cases, a highly-anticorrosive material, such as chromium and nickel, is selected for the first heat-conductive layer 1 from among the above materials. In order to prevent the first heat-conductive layer 1 from the corrosion by the ink, surface treatment, such as electroless plating and plasma polymerization, may be applied onto the first heat-conductive layer 1.

Separation assisting layer 2 is formed to be a thin film on a large-sized glass substrate, and then, is separated from the substrate. As the material of the separation assisting layer 2, a material which can be separated from the substrate to be used and has a lower heat conductivity than that of first heat-conductive layer 1 is preferably used. For example, any of heat-resistant polymeric resin materials, such as polyimide, and insulating materials containing silicon can be used. Those materials are used in order to, in a later process of irradiating an amorphous silicon film with an excimer laser to crystallize the amorphous silicon film, minimize a heat conduction from the amorphous silicon film and keep the temperature necessary to melt the amorphous silicon film. Since the time period to melt the amorphous silicon film is as much short as several tens nanoseconds per period, a use of a material having a low heat conductivity, including a heat-resistant polymeric resin material such as polyimide, for separation assisting layer 2 on a substrate having a low heat conductivity allows the separation assisting layer 2 to keep a temperature necessary to melt the amorphous silicon film regardless of its thickness.

On the other hand, the time period that an electric current is sent to heating resistor 8 to generate heat on causing an inkjet print head to conduct printing is as long as several microseconds per cycle, which is longer than the time period to melt the amorphous silicon film. Therefore, separation assisting layer 2 is preferably thin for conducting the heat generated in heating resistors 8 to first heat-conductive layer 1 in short time. The thickness of separation assisting layer 2 is preferably equal to or less than 100 µm, though it should be noted that the excessively small thickness of separation assisting layer 2 makes separation of itself, on which TFTs, heating resistors and nozzles have been formed, from the glass substrate difficult.

If circumstances require, there may be provided an under-separation-assisting layer, which is smaller in thickness than separation assisting layer 2, between the separation assisting layer 2 and the glass substrate, so as to make the construction that the separation assisting layer 2 can be separated from the glass substrate easily.

Some of heat-resistant polymeric resins used for separation assisting layer 2, when being actually used for separation assisting layer 2, can be changed in quality because of the heat treatment process for manufacturing an inkjet print head, and can stick tightly to the glass substrate, which makes the separation assisting layer 2 hardly separated from the glass substrate. In this case, as an under-separation-assisting layer, there may be arranged a layer of an organic material which is hardly changed in quality by heat treatment processing, under the separation assisting layer 2 so that the separation assisting layer 2 can be mechanically separated with ease, though it is difficult to make the thickness of the organic layer sufficiently thick to be used as separation assisting layer 2, because of its great membrane stress.

Further, in some cases, a layer of a material to disappear or be changed in quality due to a laser, can be formed under the separation assisting layer 2. In such a construction, a silicon film formed all over the substrate is irradiated with an excimer laser from the upper-surface side for crystallizing the silicon layer, and the under-separation-assisting layer is not affected by the excimer laser. Therefore, on separating the separation assisting layer 2 from the glass substrate as described later, just a irradiation of the under-separation-assisting layer with an excimer laser can make the under-separation-assisting layer disappear or can make the under-separation-assisting layer changed in quality so as to be separated from the glass substrate. Alternatively, the under-separation-assisting layer may be separated by using any of organic solvents and acids.

On the separation assisting layer 2 (on the surface facing the nozzles 12), there is arranged undercoat film 3 for restricting impurities contained in the glass substrate from spreading up to TFTs in a process of forming the TFTs. As a material of the undercoat film 3, similarly to separation assisting layer 2, a material which has a lower heat conductivity than that of first heat-conductive layer 1 is preferably used in order to keep the temperature necessary to melt the amorphous silicon film on crystallizing the amorphous silicon layer. As examples of the material of undercoat film 3, there are cited insulating films containing silicon, such as a silicon oxide film and a silicon nitride film; and a multilayer film of any combination of these films.

On the separation assisting layer 2, a polycrystalline silicon film 4 is formed and is patterned into islands, to be an active layer of each TFT forming the drive circuit and an active layer of each TFT for controlling electricity applied to heating resistor 8.

On the polycrystalline silicon layer 4, there is an insulating film to be gate insulating film 5. For example, the gate insulating film 5 is composed of one of a silicon oxide film, a silicon nitride film and a multilayer film constituted by these films.

On the gate insulating film 5, there is arranged gate electrode film 6 patterned to form gate electrodes. The gate electrode film 6 is composed of, for example, a film formed of one of tungsten, chromium, molybdenum, niobium, an alloy containing one or more of those metals, and a polycrystalline silicon, or a multilayer film constituted by any combination of these materials.

On the gate electrode film 6, there is arranged interlayer insulating film 7. The interlayer insulating film 7 is composed of, for example, a single-layer film, such as a silicon oxide film, a silicon nitride film and an organic film, or a multilayer film constituted by any combination of these films.

On the interlayer insulating film 7, there are heating resistors 8 formed by patterning. Each of the heating resistors 8 is arranged, when being viewed in the perpendicular direction (the normal direction) to the separation assisting layer 2, at a position not overlapping with the active layer of a TFT (a region where a channel is formed when the TFT works) so as to minimize the influence of the heat generated by the heating resistor 8 on the TFT. The heating resistors 8 may be made of, for example, any one of alloy of tantalum and aluminum, tantalum nitride, mixture of tantalum and $SiO_2$, and alloy of nickel and chromium, with the thickness of 100 to 5000 nm.

On the heating resistors 8, there are arranged electrode films 9 including those to be connected to the heating resistors 8 and source and drain electrode films 9 of the drive circuit. As examples of the material of these electrode films 9, there are cited aluminum and alloy containing aluminum.

On the electrode films 9, there is passivation film 10 formed all over the surface of the construction. The passivation film 10 is composed of, for example, a single-layer film, such as a silicon oxide film and a silicon nitride film; a multilayer film constituted by these films; or an organic film. Above the heating resistor 8, there is formed an insulating film for maintaining insulating properties between the ink and the heating resistors 8, and a cavitation resistant film. The cavitation resistant film can be made of any of hard metals such as tantalum and alloy of tantalum.

On the passivation film 10, there is a patterned inorganic film or resin film 11. On the inorganic film or resin film 11 as the top layer of the constitution, nozzles 12 are formed.

In an inkjet print head having the above constitution, ink is supplied to ink supply port 13 being a hole running through first heat-conductive layer 1 and separation assisting layer 2, and is further supplied to heating resistor 8 through ink channel 13a illustrated in FIG. 1B. Then, ink droplets are ejected from nozzles 12 by using air bubbles generated by the heat coming from the heating resistors 8 and impact on a medium.

In these processes, a part of the heat generated in heating resistors 8 is consumed in generating air bubbles and the other part is conducted to the first heat-conductive layer 1 through interlayer insulating film 7, gate insulating film 5, undercoat film 3 and separation assisting layer 2. Since the almost part of heating resistors 8 is covered with materials each with low heat conductivity, the heat is hardly conducted in the horizontal direction with respect to separation assisting layer 2. However, because of the small thickness of each of the interlayer insulating film 7, gate insulating film 5, undercoat film 3 and separation assisting layer 2, and existence of the first heat-conductive layer 1 with high heat conductivity, it can be considered that almost the heat is conducted in the perpendicular direction with respect to the separation assisting layer 2.

In the present embodiment, because of the small thickness of the separation assisting layer 2 and the existence of the first heat-conductive layer 1 having a large-sized area, the first heat-conductive layer 1 conducts the heat efficiently in the horizontal direction to radiate the heat. In the case that the ink touches with the first heat-conductive layer 1 located under the separation assisting payer 2, the heat generated by heating resistors 8 is cooled also by the ink and the heat can be radiated more efficiently.

Figure 4:
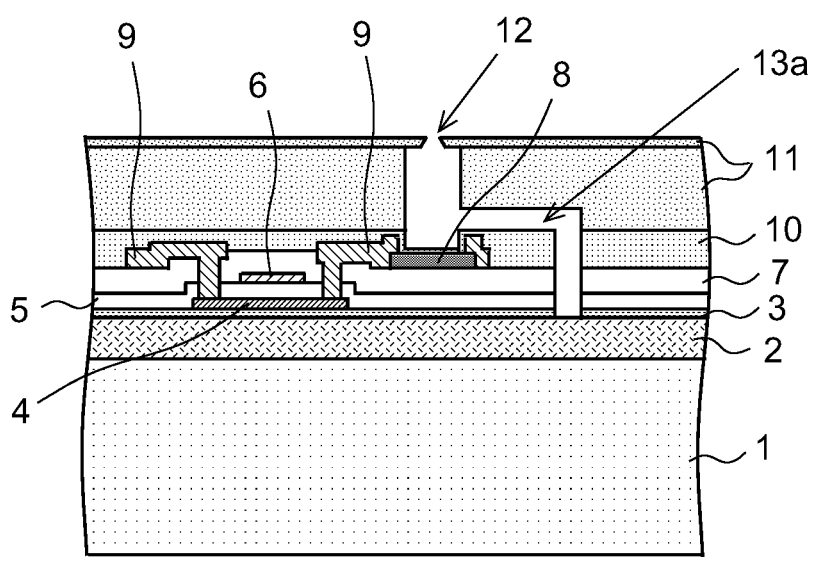
FIG. 4 is a cross-sectional view of another inkjet print head of the first embodiment.

As another example of the inkjet print head illustrated in FIGS. 1A, 1B and 2, ink supply port 13 can have a different structure from the structure illustrated in FIGS. 1A and 1B, in other words, the inkjet print head can have just a part of the illustrated ink supply port 13. The construction has the cross section illustrated in FIG. 2 when the cross section is taken on a part including both nozzle 12 and ink supply port 13, and has the cross section illustrated in FIG. 4 when the cross section is taken on a part including nozzle 12. The inkjet print head described in the present embodiment is a roof-shooter print head, but the same effects can be obtained if the illustrated inkjet print head is a side-shooter print head.

Hereinafter, a manufacturing method of the inkjet print head of the first embodiment will be described by using FIGS. 5A to 5K. FIGS. 5A to 5K illustrate sectional structures (sectional structures taken along the line II-II of FIG. 1B) in respective processes of the manufacturing method of the inkjet print head as the first embodiment.

Figure 5A:
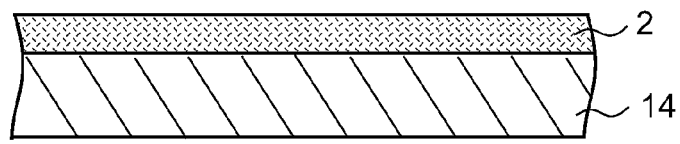
FIGS. 5A to 5K are diagrams illustrating processes of a manufacturing method of the inkjet print head of the first embodiment.

First, on a substrate (glass substrate 14) made of a reasonable material with a low heat conductivity, such as glass, separation assisting layer 2 is formed by technique such as application, plasma CVD (Chemical Vapor Deposition) and sputtering (see FIG. 5A). The separation assisting layer 2 is 100 μm or less in thickness, and is formed to be thinner than the first heat-conductive layer 1 to be a supporting substrate. The separation assisting layer 2 may be annealed at the same extent as the temperature of annealing to be conducted in the later process, for example, about 500° C., for preventing the separation assisting layer 2 from deforming due to annealing.

Next, on the separation assisting layer 2, any one of a silicon oxide film, a silicon nitride film and a multilayer film constituted by them is formed as undercoat film 3 by using a deposition technique such as plasma CVD to have the thickness in the range of 10 to 1000 nm. Further, in order to form polycrystalline silicon film 4 to be an active layer of TFTs, an amorphous silicon film is formed as a precursor by using a deposition technique such as plasma CVD. The thickness of the amorphous silicon film is not limited to a particular value, but is preferably in the range of 5 to 1000 nm, and more preferably in the ranged of 10 to 100 nm. By forming successively the undercoat film 3 and the amorphous silicon film as the precursor of the active layer by using one and the same plasma CVD device without these films being exposed in the air, it can prevent contamination of the part between the undercoat film 3 and the amorphous silicon film by impurities. Further, a small amount of phosphor or boron may be added into the amorphous silicon film as the precursor by using technique such as ion doping and ion implantation, for controlling the threshold of the TFTs.

Figure 5B:
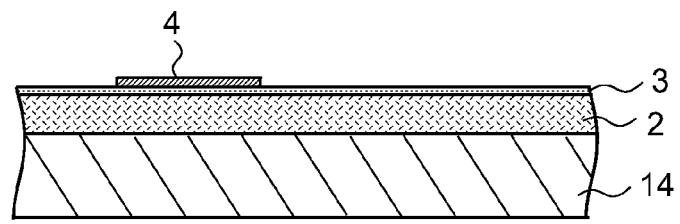
Figure 5C:
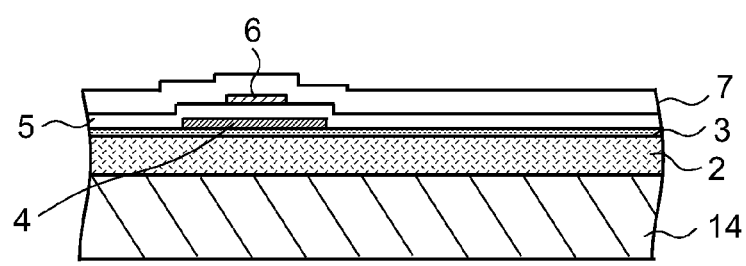
Figure 5D:
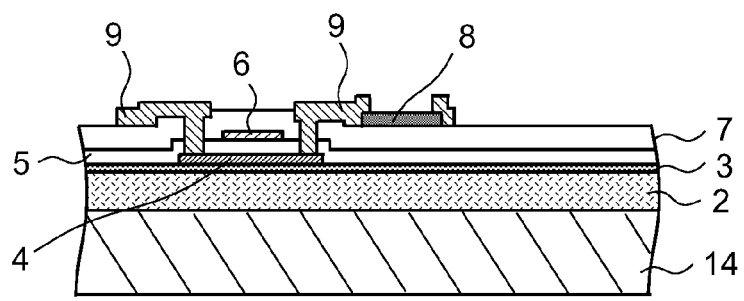
Figure 5E:
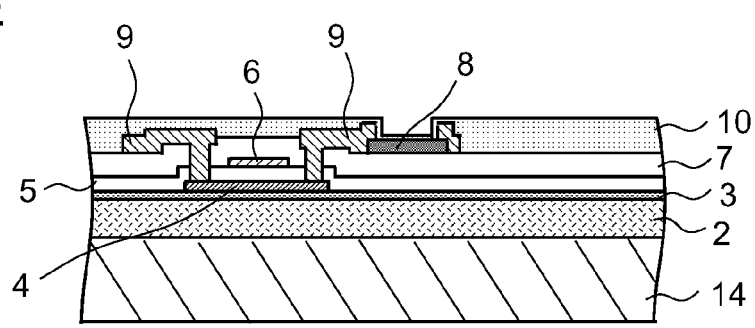
Figure 5F:
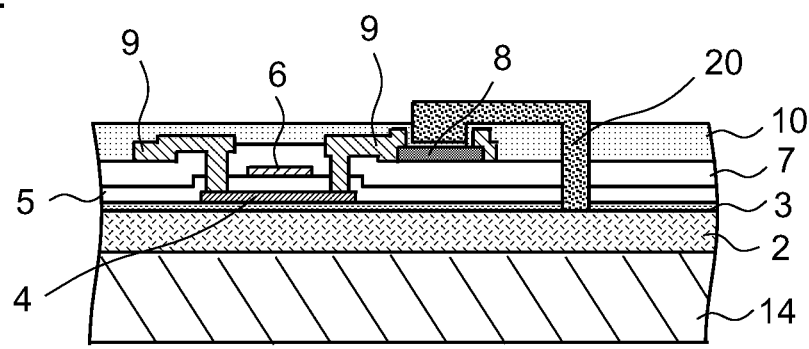

Next, the amorphous silicon film as the precursor is irradiated with an excimer laser (that is, laser annealing is applied onto the amorphous silicon film), to form polycrystalline silicon film 4 with excellent performance, and the polycrystalline silicon film 4 is patterned into a desired shape by photolithography and dry etching (see FIG. 5B). After the patterning process, the regions of the polycrystalline silicon film 4 to be formed into source and drain regions may be covered with resists and then impurities such as phosphor or boron may be implanted into the polycrystalline silicon film 4 by using technique such as ion doping and ion implantation. Alternatively, the impurity implantation process may be conducted after the process of forming gate insulating film 5 and gate electrode film 6 which will be conducted later.

After that, one of a silicon oxide film, a silicon nitride film and a multilayer film constituted by these films is formed as gate insulating film 5 by using deposition technique such as plasma CVD to have the thickness in the range from 30 to 300 nm. On the resulting film, any one of a metal film formed by technique such as sputtering, a silicon film containing phosphor or boron and formed by technique such as plasma CVD, and a multilayer film constituted by these films is patterned by photolithography, dry etching and wet etching, into gate electrode film 6. Further, annealing processing is conducted at the temperature in the range of about 400° C. to about 600° C., for activating the impurities such as phosphor and boron which have been implanted into the source and drain electrodes. Next, any one of a silicon oxide film, a silicon nitride film, an organic film and a multilayer film constituted by any combination of these films is formed as interlayer insulating film 7 by using technique such as plasma CVD (see FIG. 5C). Then, in order to terminate defects of the polycrystalline silicon film 4 and defects at the boundary between the polycrystalline silicon film 4 and the gate insulating film 5 by hydrogen, annealing processing for diffusing hydrogen existing in the interlayer insulating film 7 is conducted. If occasions demand, hydrogen plasma treatment may be conducted in place of the annealing processing for diffusing hydrogen, before forming the interlayer insulating film 7.

Next, to form heating resistors 8, a layer of one material selected from alloy of tantalum and aluminum, tantalum nitride, mixture of tantalum and $SiO_2$, and alloy of nickel and chromium is formed, and the layer is patterned by photolithography and dry or wet etching. Next, in order to connect the source and drain regions of TFTs and the source and drain electrodes, resists are patterned by photolithography and then the interlayer insulating film 7 and the gate insulating film 5 are processed by dry etching and wet etching, to make contact holes. Then, as electrode film 9 to be source and drain electrodes, a layer of aluminum or alloy containing aluminum is formed, and the layer is patterned by photolithography and dry or wet etching. In this process, electrode film 9 and heating resistor 8 are connected to each other (see FIG. 5D).

Next, as passivation film 10, any one of a silicon oxide film, a silicon nitride film, a multilayer film constituted by these films, and an organic film is formed all over the construction by using technique such as plasma CVD, sputtering and application. Further, by etching partially the passivation film arranged above the heating resistor 8, and reducing the thickness, a region of an insulating film laid above the heating resistor 8 is formed (see FIG. 5E). This etching should be conducted depending on the situation, and is not conducted if it is unnecessary. In certain cases, passivation film 10 may be formed not to be laid above the heating resistor 8, and another insulating film may be formed only above the heating resistor 8 and then be patterned into a desired form. Further, a cavitation-resist film is formed above the heating resistor 8 for protecting the heating resistor 8 from impact to be received when bubbles of ink form or dissipate.

Next, resists are patterned on the part to be an ink channel by using photolithography, and then, the part to be the ink channel is formed by conducting dry etching or wet etching on the resulting construction up to separation assisting layer 2. If it is necessary, the part to be the ink channel may be formed by conducting the dry etching or the wet etching up to the glass substrate. Further, a resin film (called as "sacrificial resin film 20") is formed and patterned so as to fill the part to be an ink channel which includes the resulting hole (see FIG. 5F).

Figure 5G:
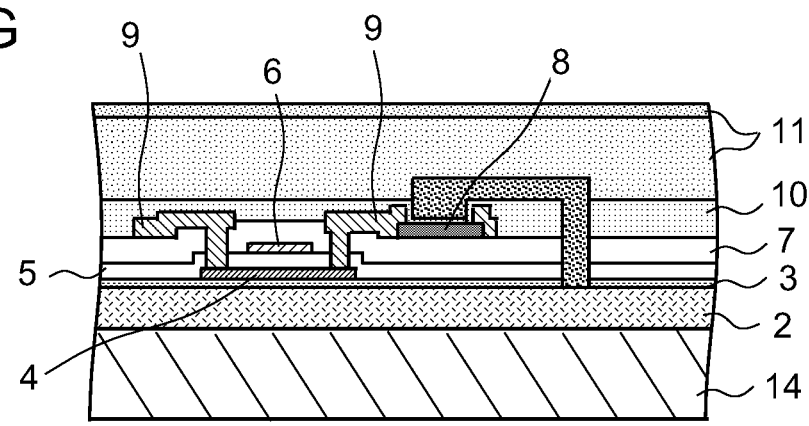

Next, on the resulting construction, one of a resin film, an inorganic film such as a silicon oxide film and a silicon nitride film, and a multilayer film constituted by any combination of these films (these will be generally called as an inorganic film or resin film 11) is formed by using technique such as application, plasma CVD and sputtering (see FIG. 5G).

Figure 5H:
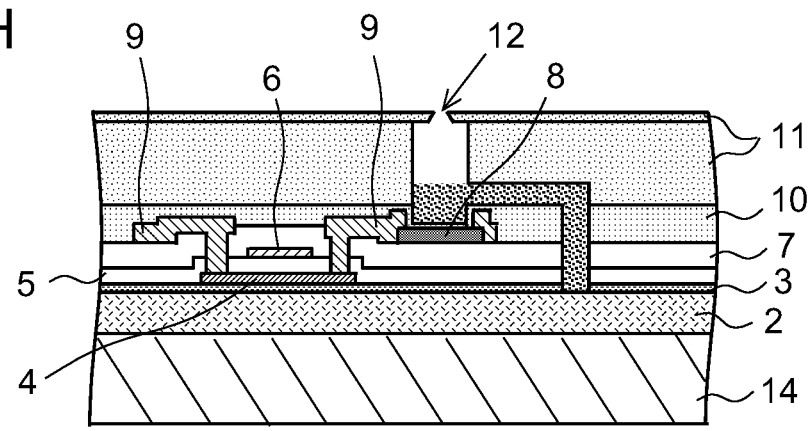

Next, in order to form nozzles 12, resists are formed on the resulting film into a desired pattern by using photolithography, and dry etching and/or wet etching is conducted thereon up to the sacrificial resin film 20 (see FIG. 5H).

Figure 5I:
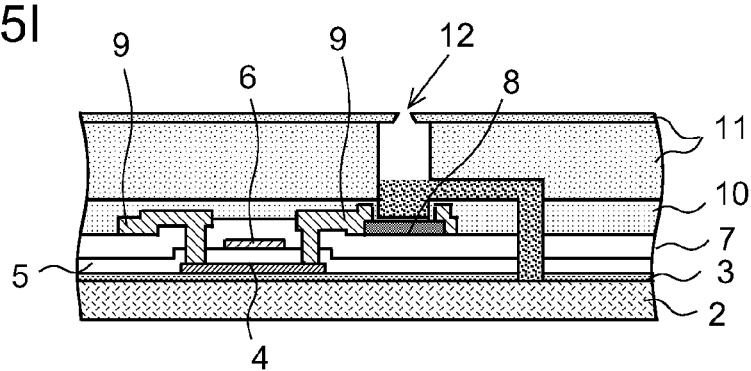

Next, separation assisting layer 2 on which TFTs, heating resistors 8 and nozzles 12 have been formed, is separated from glass substrate 14 (see FIG. 5I). This separation process may be conducted by using any one of a laser and etching with organic solvent or acid. This process separates the construction formed by the above processes into two bodies: the portion that components including TFTs, heating resistors 8 and nozzles 12 have been formed on separation assisting layer 2; and glass substrate 14. The glass substrate 14 is reused for forming other inkjet print heads, after being cleaned.

Figure 5J:
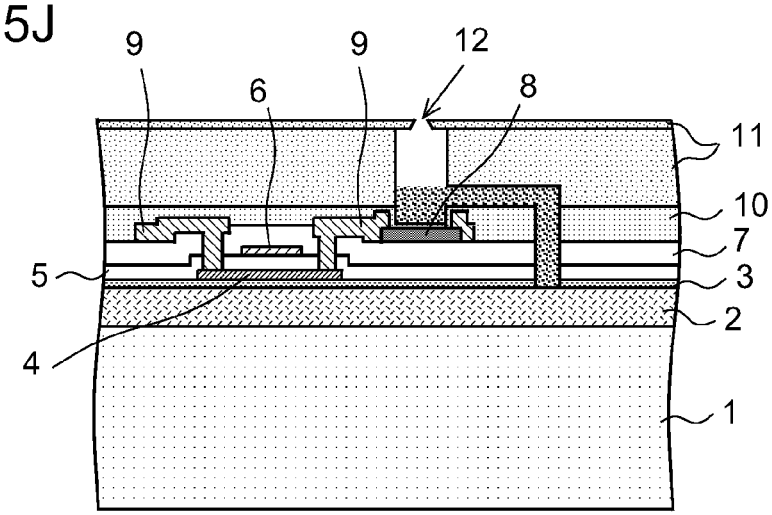
Figure 5K:
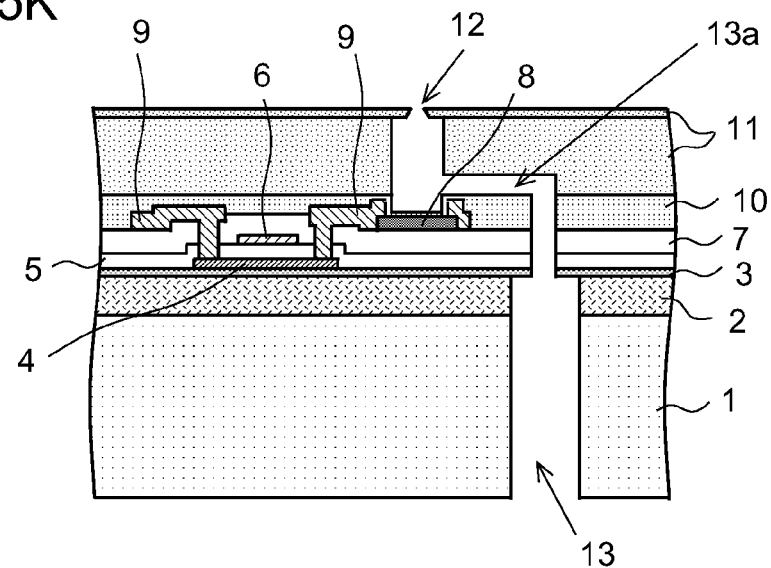

Next, on the bottom surface of the separation assisting layer 2 (the opposite surface to nozzles 12), first heat-conductive layer 1 is formed by technique such as sputtering, electroless deposition and vapor deposition (see FIG. 5J). The first heat-conductive layer 1 may be prepared by forming a single-layer film of one material selected from metals including aluminum, chromium, gold, copper, tungsten, platinum, nickel, iron, molybdenum and titanium; alloy of any of the metals and another metal; carbon materials with high heat conductivity, including graphene and carbon nanotubes; and insulating materials with high heat conductivity, such as aluminum nitride, or a multilayer film constituted by any combination of these materials. Alternatively, the first heat-conductive layer 1 may be prepared by sticking metallic foil or metallic transfer-film onto the separation assisting layer 2. The forming process of the first heat-conductive layer 1 is conducted after polycrystalline silicon film 4 has been formed (after an amorphous silicon layer has been formed and laser annealing has been conducted on to the amorphous silicon layer).

Next, after resist material is applied onto the surface of the first heat-conductive layer 1, a part of the resist to be ink supply port 13 is patterned by photolithography. In this process, the first heat-conductive layer 1 is exposed with the part of the resist being aligned so as to be connected with the hole to be an ink channel which has already been formed (see FIG. 5F). After that, by using dry etching such as RIE (Reactive Ion Etching) and ion milling or wet etching, a hole is formed in first heat-conductive layer 1 and separation assisting layer 2, starting at the side of the first heat-conductive layer 1, to be connected with the hole which is to be an ink channel and is now filled with sacrificial resin film 20. The hole may be formed by micro sand blasting or a laser. Finally, the sacrificial resin film 20 is removed by organic solvent to form an inkjet print head (see FIG. 5K).

As described above, in the manufacturing method of the present embodiment, no heat treatment at high temperature is conducted after first heat-conductive layer 1 is formed on the bottom surface of separation assisting layer 2, which hardly causes a warp of the substrate, as described in JP-A No. 2002-316419, coming from the stress of thin films expanded with heat. Therefore, the thickness of the separation assisting layer 2 can be arbitrarily selected regardless of the warp of the substrate coming from the stress of thin films. When the separation assisting layer 2 is formed to be thin (for example, 100 μm or less), the heat generated in heating resistors 8 can be conducted to first heat-conductive layer 1 and is released to the outside. Such a construction can be repeatedly driven at high speed and can provide an inkjet print head suitable for high-speed drawing.

Further in the present embodiment, polycrystalline silicon is formed by irradiating amorphous silicon as a precursor with an excimer laser. The amorphous silicon is deposited on insulating films (separation assisting layer 2 and undercoat layer 3) with lower heat conductivity in comparison with the first heat-conductive layer 1, and therefore, the heat generated by the irradiation of the excimer layer is hardly released from the deposited amorphous silicon and the sufficient temperature for forming polycrystalline silicon can be maintained in the deposited amorphous silicon. Accordingly, high-performance TFTs can be formed.

The present embodiment was described by using planar TFTs, but an embodiment using inverted-staggered TFTs can provide the same effects.

Second Embodiment

Another example of the manufacturing method of the first embodiment will be described as the second embodiment. FIGS. 6A to 6K illustrate sectional structures (sectional structures taken along the line II-II in FIG. 1B) in respective processes of the manufacturing method of the inkjet print head as the second embodiment.

Figure 6A:
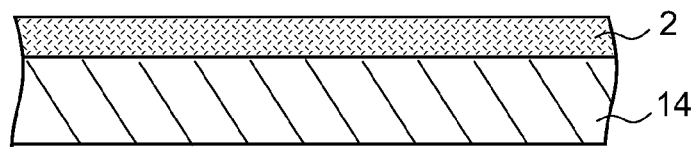
FIGS. 6A to 6K are diagrams illustrating processes of a manufacturing method of the inkjet print head of the second embodiment.
Figure 6B:
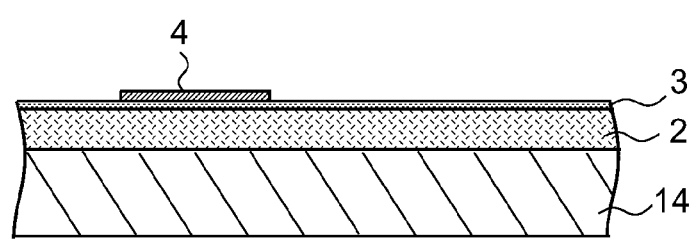

First, similarly to the first embodiment, on a substrate (glass substrate 14) made of a reasonable material with a low heat conductivity, such as glass, separation assisting layer 2 is formed (see FIG. 6A). Further, as a precursor to be used for forming undercoat film 3 and polycrystalline silicon film 4, an amorphous silicon film is formed, and then, is irradiated with an excimer laser (that is, laser annealing is applied onto the amorphous silicon film), to form polycrystalline silicon film 4 with excellent performance. After that, the polycrystalline silicon film 4 is patterned into a desired shape by photolithography and dry etching (see FIG. 6B).

Figure 6C:
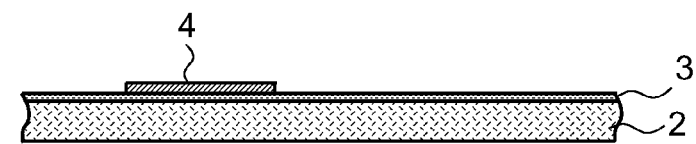

Next, separation assisting layer 2 is separated from glass substrate 14 (see FIG. 6C). This separation process may be conducted by using any one of a laser and etching with organic solvent or acid. Since just the undercoat film 3 and the patterned polycrystalline silicon film 4 are on the separation assisting layer 2, which is different from the first embodiment, the separation assisting layer 2 can be separated from the glass substrate 14 easily. The glass substrate 14 from which the separation assisting layer 2 has been separated, is reused for forming other inkjet print heads, after being cleaned.

Figure 6D:
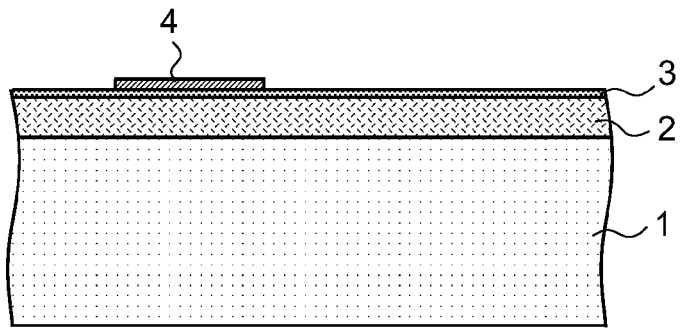
Figure 6E:
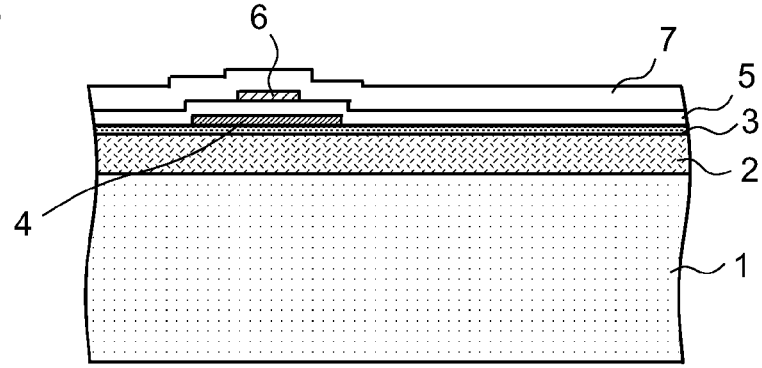
Figure 6F:
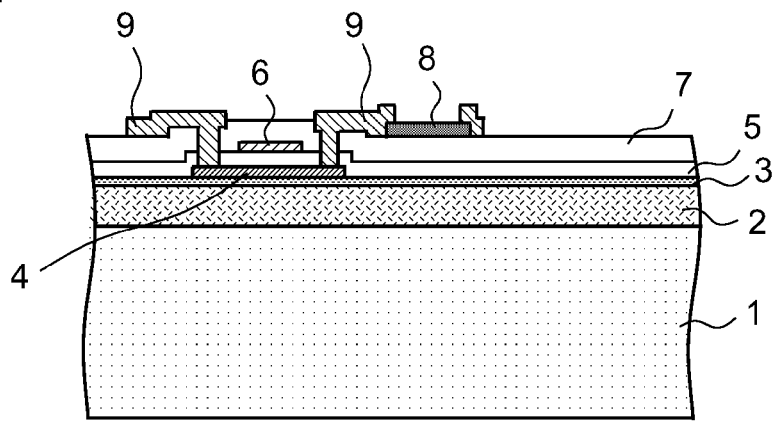
Figure 6G:
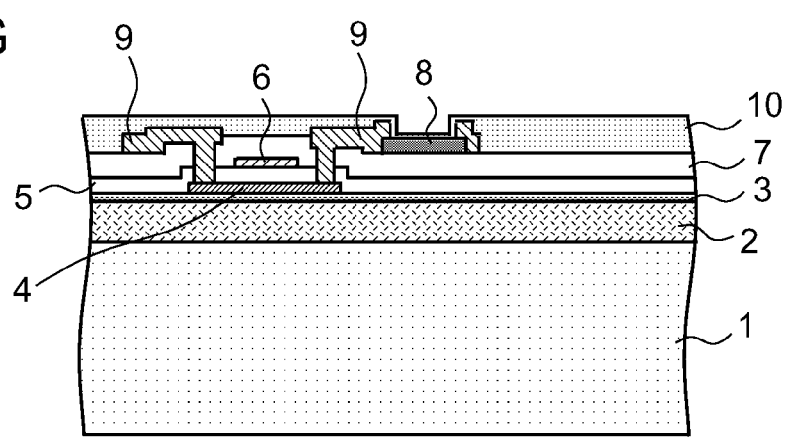
Figure 6H:
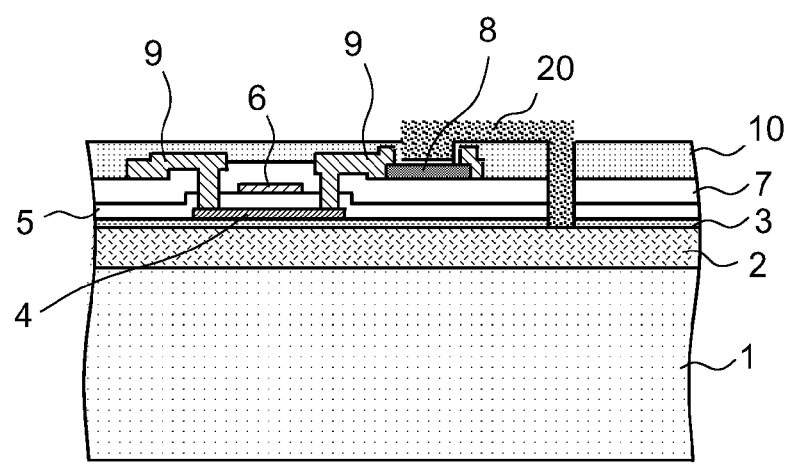
Figure 6I:
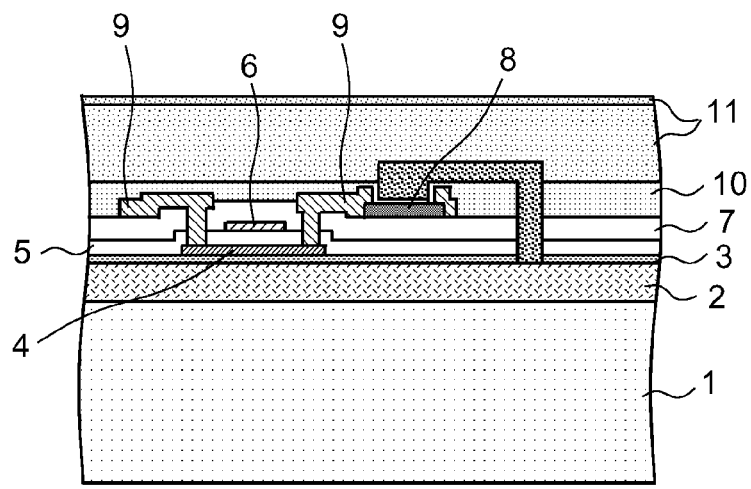
Figure 6J:
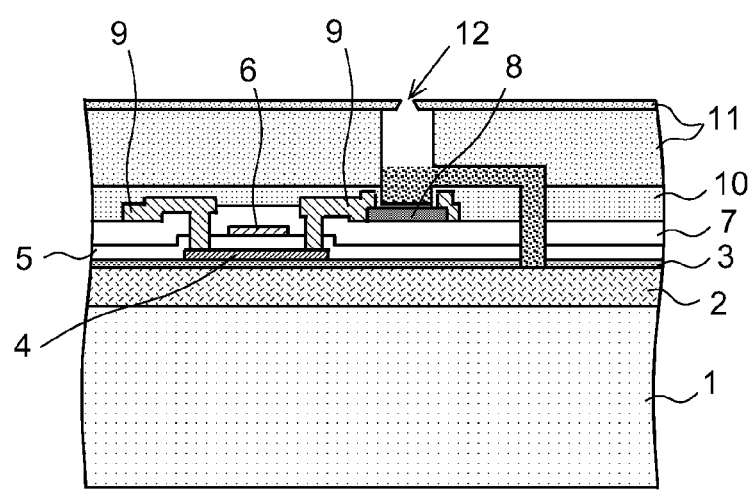
Figure 6K:
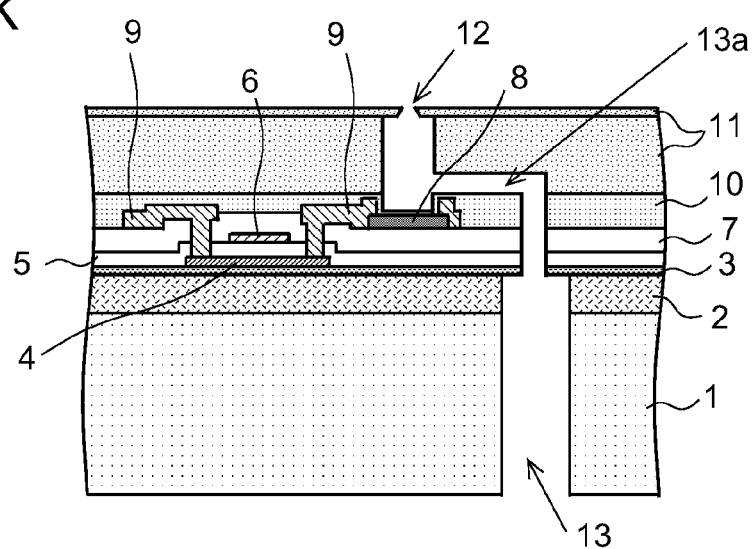

Next, on the bottom surface of the separation assisting layer 2 (the opposite surface to undercoat film 3), first heat-conductive layer 1 is formed by technique such as sputtering, electroless deposition and vapor deposition (see FIG. 6D). The first heat-conductive layer 1 may be prepared by forming a single-layer film of one material selected from metals including aluminum, chromium, gold, copper, tungsten, platinum, nickel, iron, molybdenum and titanium; alloy of any of the metals and another metal; carbon materials with high heat conductivity, including graphene and carbon nanotubes; and insulating materials with high heat conductivity, such as aluminum nitride, or a multilayer film constituted by any combination of these materials. Alternatively, the first heat-conductive layer 1 may be prepared by sticking metallic foil or metallic transfer-film onto the separation assisting layer 2. The forming process of the first heat-conductive layer 1 is conducted after polycrystalline silicon film 4 has been formed (after an amorphous silicon layer has been formed and laser annealing has been conducted on to the amorphous silicon layer).

After that, similarly to the first embodiment, components from the gate insulating film to the nozzles are formed (see FIGS. 6E to 6J).

Next, after resist material is applied onto the surface of the first heat-conductive layer 1, a part of the resist to be ink supply port 13 is patterned by photolithography. In this process, the first heat-conductive layer 1 is exposed with the part of the resist being aligned so as to be connected with the hole to be an ink channel which has already been formed (see FIG. 6H). After that, by using dry etching such as RIE (Reactive Ion Etching) and ion milling or wet etching, a hole is formed in first heat-conductive layer 1 and separation assisting layer 2, starting at the side of the first heat-conductive layer 1, to be connected with the hole which is to be an ink channel and now filled with sacrificial resin film 20. The hole may be formed by micro sand blasting or a laser. Finally, the sacrificial resin film 20 is removed by organic solvent to form an inkjet print head (see FIG. 6K).

Third Embodiment

Another example of the manufacturing method of the first embodiment will be described as the third embodiment. FIGS. 7A to 7E are top views of an inkjet print head illustrating respective processes of the manufacturing method of the inkjet print head as the third embodiment.

Figure 7A:
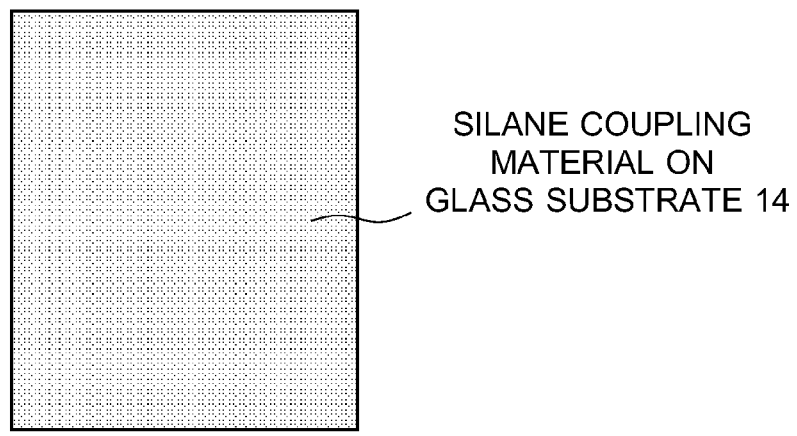
FIGS. 7A to 7E are diagrams illustrating processes of a manufacturing method of the inkjet print head of the third embodiment.
Figure 7B:
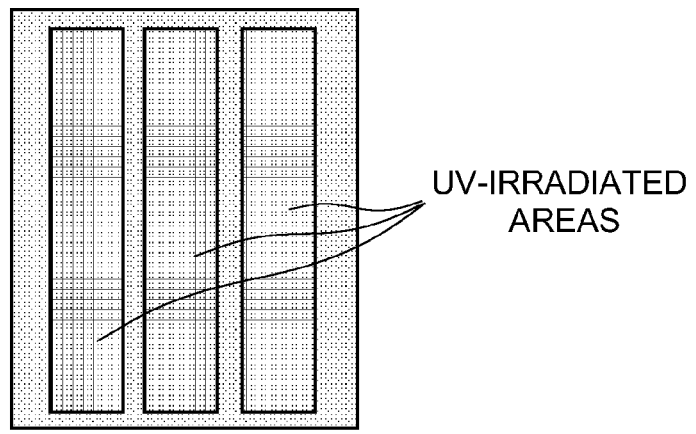
Figure 7C:
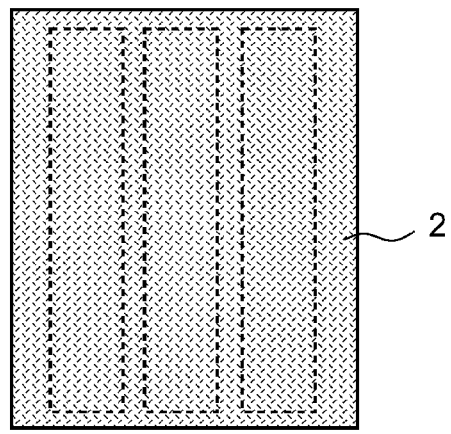

First, a silane-coupling agent is applied onto glass substrate 14 and is dried (see FIG. 7A). Next, areas of the applied silane-coupling agent, each of which is a little wider than the part to be an inkjet print head, are irradiated with UV rays (see FIG. 7B), and separation assisting layer 2 is formed thereon (see FIG. 7C). The reason of the process is that, in the areas irradiated with UV rays, the silane-coupling agent is resolved and the bonding strength to the separation assisting layer 2 to be formed on the areas becomes weak so that the agent can be separated from the separation assisting layer 2 easily. On the other hand, the part where no inkjet print head will be formed, is not irradiated with UV rays. Therefore, in this part, glass substrate 14 and separation assisting layer 2 are tightly bonded together, and the glass substrate 14 and separation assisting layer 2 will not be separated completely from one another.

Figure 7D:
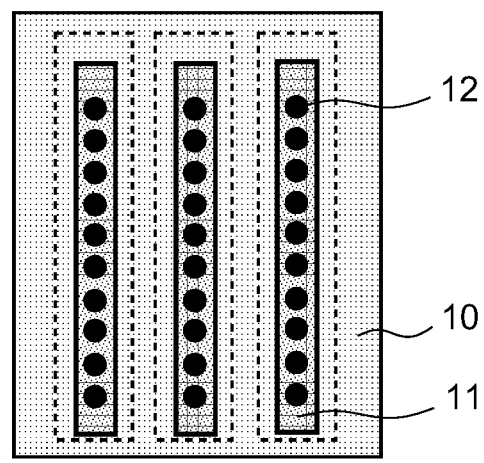
Figure 7E:
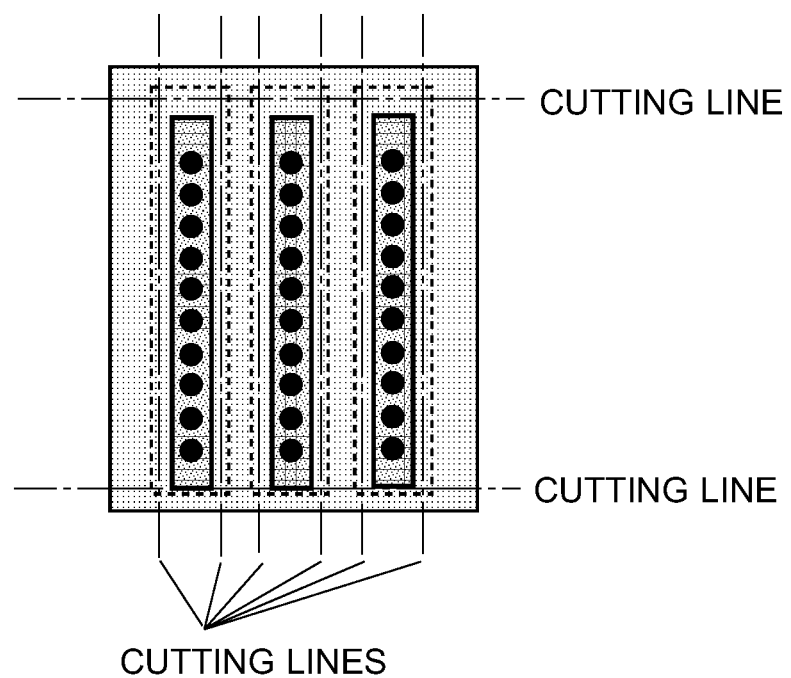

After that, similarly to the processes of the manufacturing method of the first embodiment (FIGS. 5B to 5H), components up to nozzles 12 are formed (see FIG. 7D). After that, in order to separate separation assisting layer 2 from glass substrate 14, the parts to be inkjet print heads are cut out (along the dot and dash line of FIG. 7E). In each area irradiated with UV rays (inside the dashed line of FIG. 7E), as described above, separation assisting layer 2 is easily separated from glass substrate 14, and this cutting process provides elements including nozzles 12 formed on separation assisting layer 2. Further, in each resulting element, similarly to the processes of the manufacturing method of the first embodiment (FIGS. 5J and 5K), a first heat-conductive layer is formed on the bottom surface of separation assisting layer 2 and further an ink supply port is formed, to form an inkjet print head.

Fourth Embodiment

Next, descriptions about the fourth embodiment will be given. The inkjet print head of the fourth embodiment is similar to that illustrated in FIGS. 1A to 4 other than the point that the active layer used for TFTs for controlling the drive circuit and electricity to be given to the heating resistors is formed of wide-bandgap semiconductor film having a wide bandgap, as exemplified in a film of SiC or oxide semiconductor.

That is, the heating resistors need electric current of more than 1 mA to generate heat and high voltage can be applied between the source and drain of TFTs in some cases. Since TFTs formed of a wide-bandgap semiconductor film made of a material such as SiC and oxide semiconductor have excellent resistance of source-drain voltage and have high performance such as high mobility and low off-state current, the present embodiment can provide high-performance TFTs similarly to the case of TFTs composed of polycrystalline silicon.

The processes of the manufacturing method of the fourth embodiment are the same as those of the first embodiment other than the process of forming the active layer of TFTs (the process of FIG. 5B). In the case that the material SiC is used for the active layer of TFTs, a precursor of a layer of SiC is formed, and then, laser annealing is applied onto the layer to melt the layer and conduct polycrystallization of the SiC, which provides high-performance TFTs.

Fifth Embodiment

Figure 8:
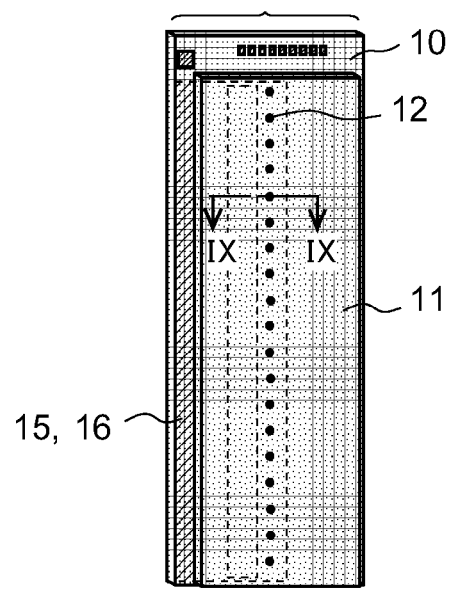
FIG. 8 is a perspective view of an inkjet print head of the fifth embodiment.

Next, descriptions about the fifth embodiment will be given by using FIGS. 8 and 9. FIG. 8 is a perspective view illustrating a construction of an inkjet print head as the fifth embodiment, and FIG. 9 is a cross-sectional view schematically illustrating the principal part of the inkjet print head, taken along the line IX-IX of FIG. 8.

Figure 9:
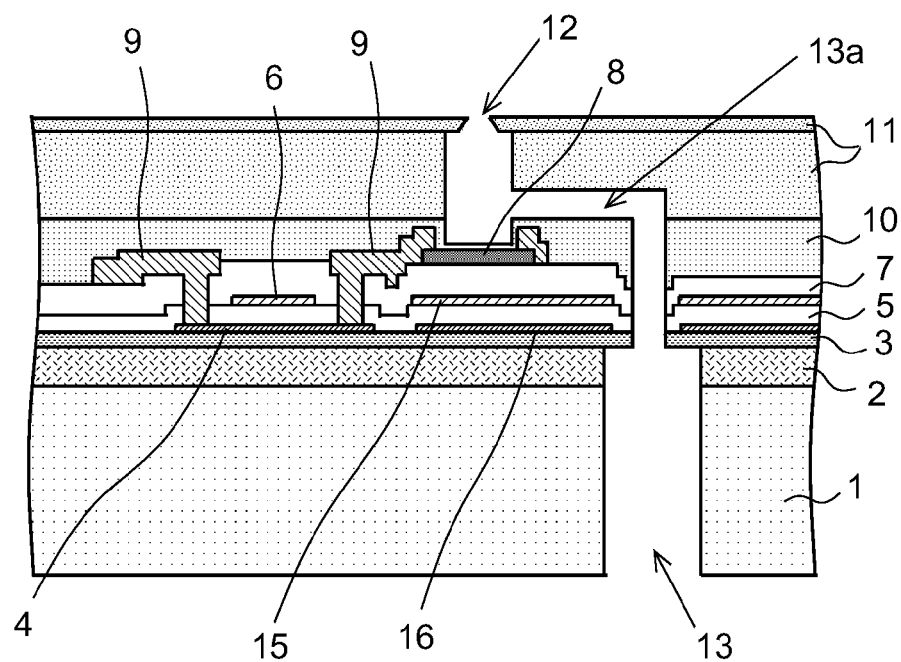
FIG. 9 is a cross-sectional view (taken along the line IX-IX of FIG. 8) of an inkjet print head illustrated in FIG. 8.

As illustrated in FIGS. 8 and 9, in the present embodiment, there are provided second heat-conductive layers 15 and 16. Second heat-conductive layer 16 extends between undercoat film 3 and gate insulating film 5 and includes regions located below respective heating resistors 8, where each of the regions has an area greater than that of corresponding heating resistor 8. Another second heat-conductive layer 15 extends between gate insulating film 5 and interlayer insulating film 7, and is also includes regions located below respective heating resistors 8, where the regions has an area greater than that of corresponding heating resistor 8. Respective parts of the second heat-conductive layers 15 and 16 are formed in greater size in comparison with the corresponding heating resistor 8. Therefore, the second heat-conductive layers 15 and 16 can receive the heat conducted from the heating resistors 8 sufficiently because of their great area, and conduct the heat to the other layers more effectively.

Further, every thermal transfer layer is located apart from the ink supply port 13, and is patterned (extends) up to the end of the inkjet print head so as to radiate heat to the outside. It is preferable that the insulation film on the surface of an electrode is removed at the end part of the inkjet print head so that the surface can radiate heat, which allows effective heat radiation. That is, the second heat-conductive layers 15 and 16 are patterned to be greater in area than heating resistors 8 and be exposed to the outside air, which allows effective heat radiation. Naturally, depending of the situation, the heat may be radiated to liquid, as exemplified in ink for use in printing, as far as it can radiate heat, rather than the outside air.

It is preferable that a material with high heat conductivity is selected for these second heat-conductive layers 15 and 16. Especially, when second heat-conductive layers 16 extending between the undercoat film 3 and gate insulating film 5 is formed of the same material as that of the active layer of TFTs, the second heat-conductive layers 16 can be formed together with the active layer of TFTs on its patterning process. The second heat-conductive layers 16 can be implanted with high concentrated impurities which are the same as those for the source and drain regions of TFTs, for enhancing the heat conductivity. In this case, if the second heat-conductive layer 16 is formed to be connected with the active layer of TFTs, the area to conduct heat can be increased, which is advantageous to radiate the heat of heating resistors 8. However, in the construction that the second heat-conductive layer 16 is connected with the active layer of TFTs, the heat is directly conducted to the active layer of TFTs and increases the temperature, which can easily cause thermal runaway and deterioration in properties of the TFTs. Under the situation that there are concerns about the problems, there is no need to connect the second heat-conductive layer 16 with the active layer of TFTs.

As for the second heat-conductive layer 15 extending between gate insulating film 5 and interlayer insulating film 7, it can be formed, when employing the same material as that of the gate electrode film 6, together with the gate electrode film 6 of TFTs on the patterning process. In this case, if the second heat-conductive layer 15 is formed to be connected with the gate electrode film 6 of TFTs, the area to conduct heat can be increased, which is advantageous to radiate the heat of heating resistors 8. However, in the construction that the second heat-conductive layer 15 is connected with the gate electrode film 6 of TFTs, the heat is directly conducted to the TFTs and increases the temperature, which can easily cause thermal runaway and deterioration in properties of the TFTs. Under the situation that there are concerns about the problems, there is no need to connect the second heat-conductive layer 15 with the gate electrode film 6 of TFTs.

As described above, by making the second heat-conductive layer 16 and the active layer of TFTs out of the same material and making the second heat-conductive layer 15 and the gate electrode film 6 of TFTs out of the same material, the inkjet print head can be manufactured without reducing the number of processes even under the situation that both of second heat-conductive layers 15 and 16 are formed, in comparison with the first embodiment. Therefore, radiation efficiency of heat generated in heating resistors 8 can be enhanced in comparison with the first embodiment.

Sixth Embodiment

Figure 10:
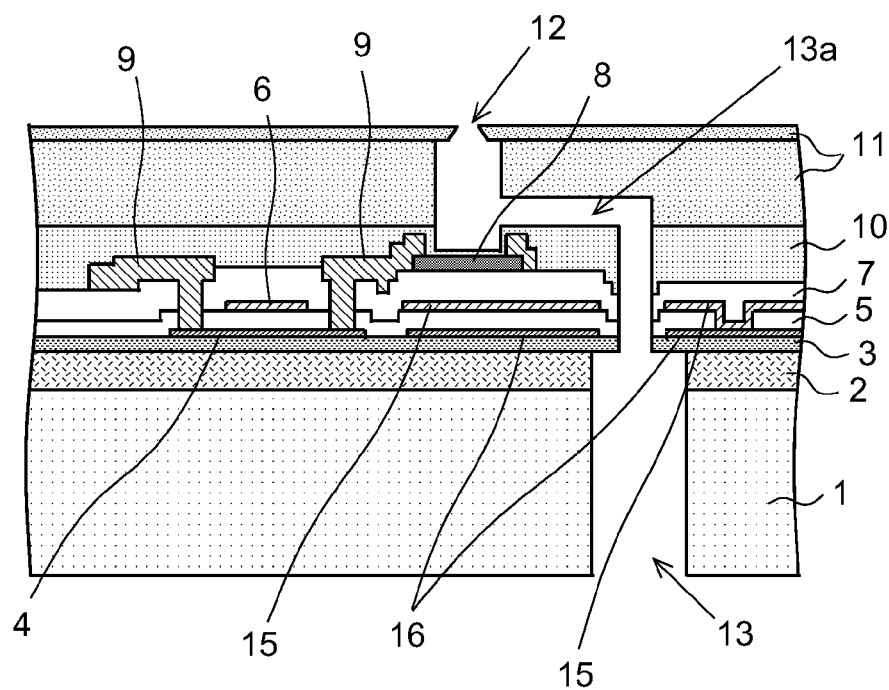
FIG. 10 is a cross sectional view of an inkjet print head of the sixth embodiment.

Next, descriptions about the sixth embodiment will be given. As illustrated in FIG. 10, in the present embodiment, there are provided second heat-conductive layers 15 and 16, which is similar to the fifth embodiment. Second heat-conductive layer 16 extends between undercoat film 3 and gate insulating film 5, and includes regions located below respective heating resistors 8, where each of the regions has an area greater than that of corresponding heating resistor 8. Another second heat-conductive layer 15 extends between gate insulating film 5 and interlayer insulating film 7, and includes regions located below respective heating resistors 8, where each of the regions has area greater than that of corresponding heating resistors 8. As points which differ from the fifth embodiment, the second heat-conductive layer 16 is not connected with the active layer of TFTs, the second heat-conductive layer 15 is not connected with the gate electrode film 6 of TFTs, and the second heat-conductive layers 15 and 16 are connected together through a contact hole of the gate insulating film 5. This construction is made by the following processes: the gate insulating film is formed and then patterned, and then, the second heat-conductive layer 15 is formed to be connected with the second heat-conductive layer 16.

The present embodiment uses more processes in comparison with the other embodiment, but can provide the following effects. In the embodiment, a material with high heat conductivity is selected for second heat-conductive layers 15 and 16, and the second heat-conductive layers 15 and 16 are connected together. Since the second heat-conductive layers 15 and 16 are not completely separated across a material with low heat conductivity, such construction can conduct heat effectively from second heat-conductive layer 15 at the upper side to second heat-conductive layer 16 closer to first heat-conductive layer 1, which can further enhance the radiation efficiency of the construction about the heat generated in heating resistors 8 in comparison with the first embodiment and the fifth embodiment.

Seventh Embodiment

Figure 11:
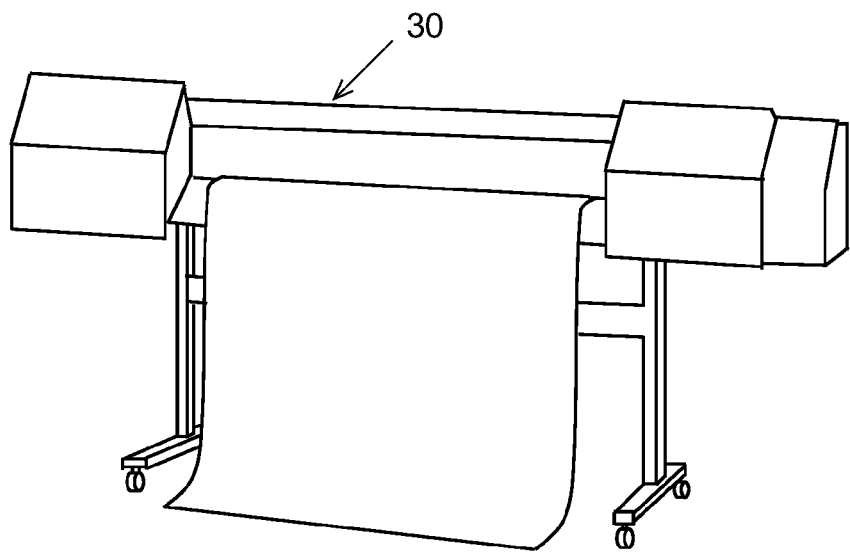
FIG. 11 is a schematic view of a line printer of the seventh embodiment.

Next, descriptions about line printer 30, which is a typical example of drawing apparatuses, will be given as the seventh embodiment. FIG. 11 is a schematic view of a line printer, as the seventh embodiment, equipped with inkjet print heads as any of the embodiments of the present invention.

The line printer includes inkjet print heads of the above embodiments, and the inkjet print heads are arrayed in plural lines with being classified by colors: yellow (Y), cyan (C), magenta (M) and black (K). Plural inkjet print heads of the above embodiments can be arrayed (arranged in line or lines) in a large area with accuracy, which allows the line printer to perform high-speed full-color printing with high resolution on medium having greater width, such as outside advertisement.

Eighth Embodiment

Figure 12:
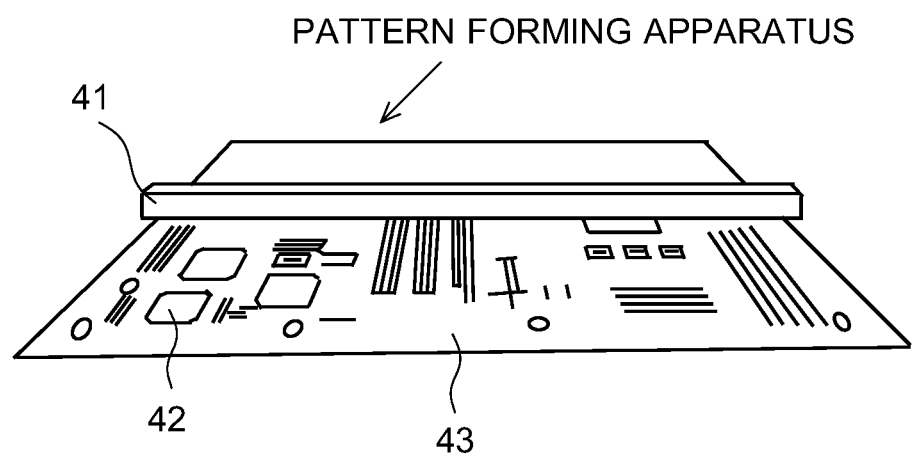
FIG. 12 is a schematic view of a pattern forming apparatus of the eighth embodiment.

Next, descriptions about pattern forming apparatus, which is another example of drawing apparatuses, will be given as the eighth embodiment. FIG. 12 is a schematic view of a pattern forming apparatus, as the eighth embodiment, equipped with an inkjet print head as one of the embodiments of the present invention.

The pattern forming apparatus forms patterns of lines 42 and others by ejecting droplets of liquid, rather than ink, from inkjet print head 41, where the liquid contains functional material. Then, after a process of drying the ejected liquid and a solidification process including reaction and solidification of the liquid, the patterns of lines 42 and others can be formed on substrate 43. Especially, by employing the inkjet print heads of the embodiments, the pattern forming apparatus can draw patterns in a large area at once. Therefore, the pattern forming apparatus can form lines on a large-sized substrate at high speed.

While the present embodiments of the present invention have been described using specific terms, such description is for illustrative purpose only, and it is to be understood that changes and variations may be made without departing from the spirit or scope of the appended claims.

In the seventh and eighth embodiments, a line printer and a pattern forming apparatus were described as examples of drawing apparatuses. However, drawing apparatuses as embodiments of the present invention are not limited to those, and may include, for example, a drawing apparatus for making an image or a pattern with luminescence material at a certain position.

The invention claimed is:

1. A manufacturing method of an inkjet print head comprising:
    forming a separation assisting layer on a substrate;
    forming heating resistors, thin-film transistors and nozzles for ejecting liquid, on the separation assisting layer;
    separating the separation assisting layer from the substrate;
    forming a first heat-conductive layer on an opposite surface of the separation assisting layer from the nozzles; and
    forming an ink supply port for supplying ink to the nozzles from a first heat-conductive layer side of the inkjet print head.

2. The manufacturing method of claim 1,
    wherein the forming the first heat-conductive layer is conducted after forming an active layer of the thin-film transistors in the forming the heating resistors, the thin-film transistors and the nozzles.

3. The manufacturing method of claim 1,
    wherein the forming the ink supply port includes
        forming a first channel running from the nozzles to the separation assisting layer,
        forming a second channel in the first heat-conductive layer, and
        connecting the first channel and the second channel together to form the ink supply port.

4. The manufacturing method of claim 1,
    wherein the forming the heating resistors, the thin-film transistors and the nozzles, includes forming an active layer of the thin-film transistors by preparing a layer of amorphous silicon and irradiating with laser for crystalizing the layer of the amorphous silicon.

* * * * *